United States Patent
Kawase

(10) Patent No.: US 10,701,851 B2
(45) Date of Patent: Jun. 30, 2020

(54) METHOD OF MOUNTING A COMPONENT ON A CIRCUIT SUBSTRATE

(71) Applicant: Panasonic Intellectual Property Management Co., Ltd., Osaka (JP)

(72) Inventor: Takeyuki Kawase, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 346 days.

(21) Appl. No.: 15/590,045

(22) Filed: May 9, 2017

(65) Prior Publication Data

US 2017/0347503 A1 Nov. 30, 2017

(30) Foreign Application Priority Data

May 26, 2016 (JP) .................................. 2016-104749

(51) Int. Cl.
*H05K 13/04* (2006.01)
*H05K 13/08* (2006.01)

(52) U.S. Cl.
CPC ........... *H05K 13/04* (2013.01); *H05K 13/084* (2018.08); *Y02P 90/10* (2015.11)

(58) Field of Classification Search
CPC ...... H05K 13/084; H05K 13/00; H05K 13/04; Y02P 90/10
See application file for complete search history.

(56) References Cited

U.S. PATENT DOCUMENTS

| | | | | |
|---|---|---|---|---|
| 4,598,459 A * | 7/1986 | Klink | ................. | H05K 13/0053 29/564.8 |
| 4,667,403 A * | 5/1987 | Edinger | ............. | G05B 19/4183 29/840 |
| 6,675,056 B1 * | 1/2004 | Black, Jr. | ............. | H05K 13/084 700/116 |
| 6,801,652 B1 * | 10/2004 | Stanzl | ................. | H05K 13/022 382/147 |
| 6,816,751 B1 * | 11/2004 | Alice | ................... | H05K 13/084 700/222 |
| 2005/0190956 A1 * | 9/2005 | Fujii | ................. | G01N 21/8851 382/141 |
| 2005/0274802 A1 * | 12/2005 | Yang | .................... | H05K 1/0266 235/439 |
| 2006/0200973 A1 * | 9/2006 | Imafuku | ............ | H05K 13/0413 29/739 |

(Continued)

FOREIGN PATENT DOCUMENTS

| | | | |
|---|---|---|---|
| JP | 2013-222828 A | 10/2013 | |
| JP | 2015-119020 A | 6/2015 | |
| WO | WO-2006090867 A2 * | 8/2006 | ......... H05K 13/0452 |

*Primary Examiner* — Peter Dungba Vo
*Assistant Examiner* — Jeffrey T Carley
(74) *Attorney, Agent, or Firm* — Pearne & Gordon LLP

(57) ABSTRACT

A component mounting method used in a system with a plurality of component mounting apparatuses includes reading out a substrate ID of a substrate and detecting whether the substrate is in a state of being able to be inserted or removed from one of the component mounting apparatuses. If the substrate is not in a state of being able to be inserted or removed, the substrate ID of the substrate is delivered by an upstream component mounting apparatus. If the substrate is in a state of being able to be inserted or removed the substrate ID is read in a downstream component mounting apparatus.

4 Claims, 7 Drawing Sheets

(56) References Cited

U.S. PATENT DOCUMENTS

| | | | |
|---|---|---|---|
| 2006/0207089 A1* | 9/2006 | Maenishi | H05K 13/084 29/832 |
| 2008/0313890 A1* | 12/2008 | Kino | H05K 13/0434 29/740 |
| 2010/0223781 A1* | 9/2010 | Sumi | H05K 13/084 29/739 |
| 2011/0302776 A1* | 12/2011 | Kato | H05K 13/0452 29/829 |

* cited by examiner

PRIOR ART

M2(M1, M3)

METHOD OF MOUNTING A COMPONENT ON A CIRCUIT SUBSTRATE

BACKGROUND

1. Technical Field

The present disclosure relates to a component mounting system and a component mounting method for mounting components on a substrate.

2. Description of the Related Art

On a component mounting line configured by connecting a plurality of component mounting apparatuses, a mounting substrate on which components are mounted on the substrate is produced. In producing the mounting substrate in the component mounting line in this manner, the substrate is specified (verified) by the substrate ID given to the substrate being read out using a camera in order to trace the substrate on which the components are mounted while the substrate is transported in order between the plurality of component mounting apparatuses (for example, refer to Japanese Patent Unexamined Publication No. 2015-119020, Japanese Patent Unexamined Publication No. 2013-222828).

In a component mounting system in Japanese Patent Unexamined Publication No. 2015-119020, the substrate ID is read out and verified prior to the components being mounted in each of the component mounting apparatuses. In a component mounting system in Japanese Patent Unexamined Publication No. 2013-222828, the substrate ID is read out at the front component mounting apparatus, and the substrate is traced by the substrate ID being transmitted to the subsequent component mounting apparatuses when the substrate is delivered to the subsequent component mounting apparatuses.

SUMMARY

There is a problem with the component mounting system in Japanese Patent Unexamined Publication No. 2015-119020 in that, although verification of the substrate is reliably performed, production efficiency of the mounting substrate is reduced since the substrate ID is read out at each of the component mounting apparatuses. Meanwhile, there is a problem with the component mounting system in Japanese Patent Unexamined Publication No. 2013-222828 in that, although it is possible to suppress reductions in production efficiency of the mounting substrate since the substrate ID is read out only by the front component mounting apparatus, inconsistencies are generated in the subsequent tracing (mounting history) when the substrates are swapped by removal or insertion of a substrate at any of the component mounting apparatuses.

Therefore, an object of the present disclosure is to provide a component mounting system and a component mounting method such that it is possible to suppress reductions in production efficiency of mounting substrates in component mounting apparatuses.

A component mounting system of the present disclosure is provided with a plurality of component mounting apparatuses for mounting components on a substrate introduced from upstream and having a substrate ID and delivering the substrate downstream, in which each of the plurality of component mounting apparatuses has recognition means for reading out the substrate ID of the substrate, state detection means for detecting that the substrate is in a state of being able to be inserted or removed, and an information acquisition portion that acquires the substrate ID of the substrate delivered by the upstream component mounting apparatus with the substrate ID being transmitted from the upstream component mounting apparatus, the information acquisition portion acquires the substrate ID transmitted from the upstream component mounting apparatus in a case where it is not detected by the state detection means that the substrate is in a state of being able to be inserted or removed, and the recognition means reads out a prescribed number of the substrate IDs for the substrates on which components are mounted in a case where it is detected by the state detection means that the substrate is in a state of being able to be inserted or removed.

A component mounting method of the present disclosure is for mounting components on a substrate in a component mounting system provided with a plurality of component mounting apparatuses for mounting the components on the substrate introduced from upstream and having a substrate ID and delivering the substrate downstream, in which each of the plurality of component mounting apparatuses has recognition means for reading out the substrate ID of the substrate, and state detection means for detecting that the substrate is in a state of being able to be inserted or removed, the substrate ID of the substrate delivered by the upstream component mounting apparatus with the substrate ID being transmitted from the upstream component mounting apparatus is acquired in a case where it is not detected by the state detection means that the substrate is in a state of being able to be inserted or removed, and the recognition means reads out a prescribed number of the substrate IDs for the substrates on which components are mounted in a case where it is detected by the state detection means that the substrate is in a state of being able to be inserted or removed.

According to the present disclosure, it is possible to suppress reductions in production efficiency of the mounting substrate in the component mounting apparatuses.

DETAILED DESCRIPTION

Figure 2:
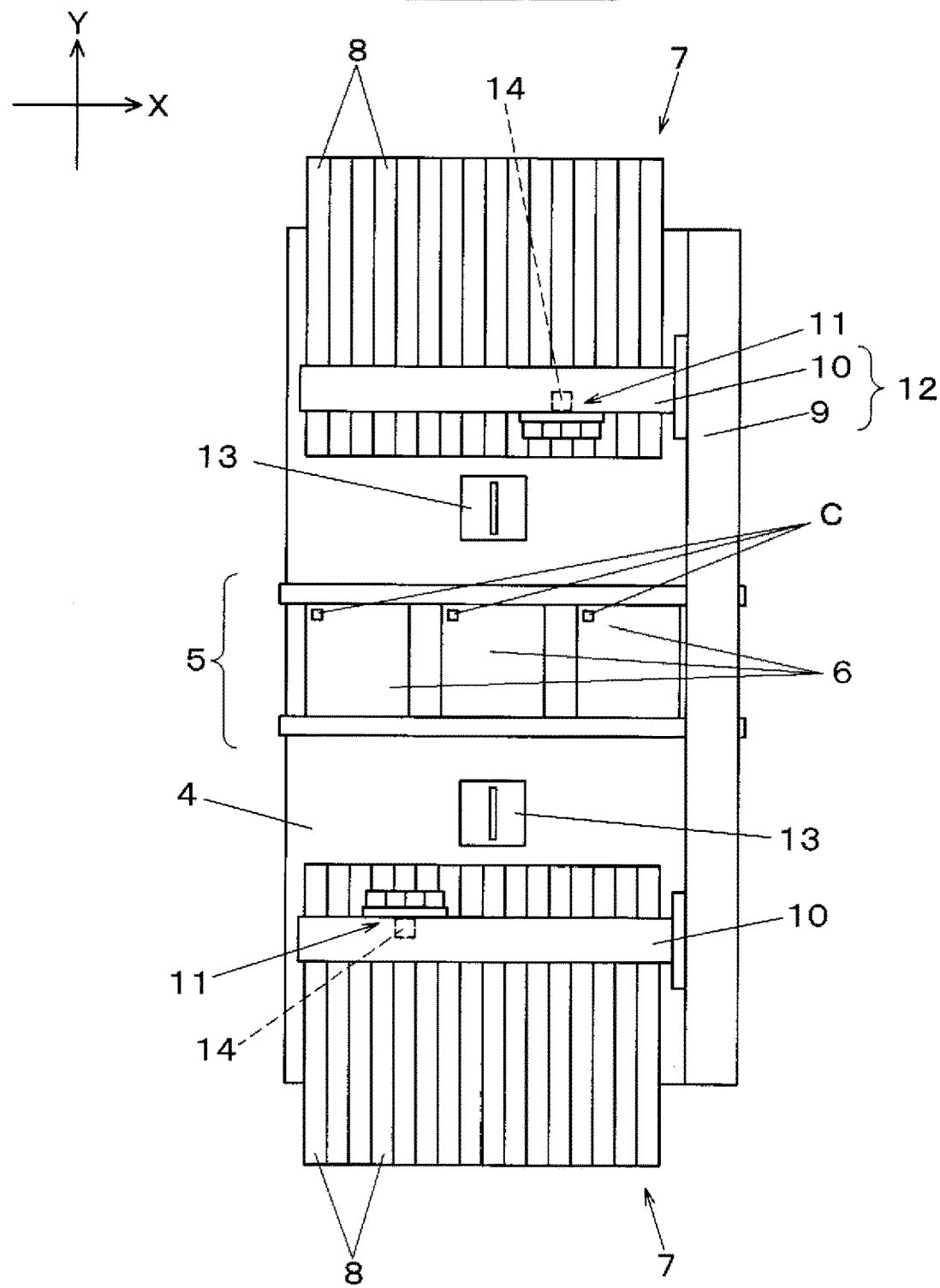
FIG. 2 is a planar view of a component mounting apparatus as an embodiment of the present disclosure.
Figure 4:
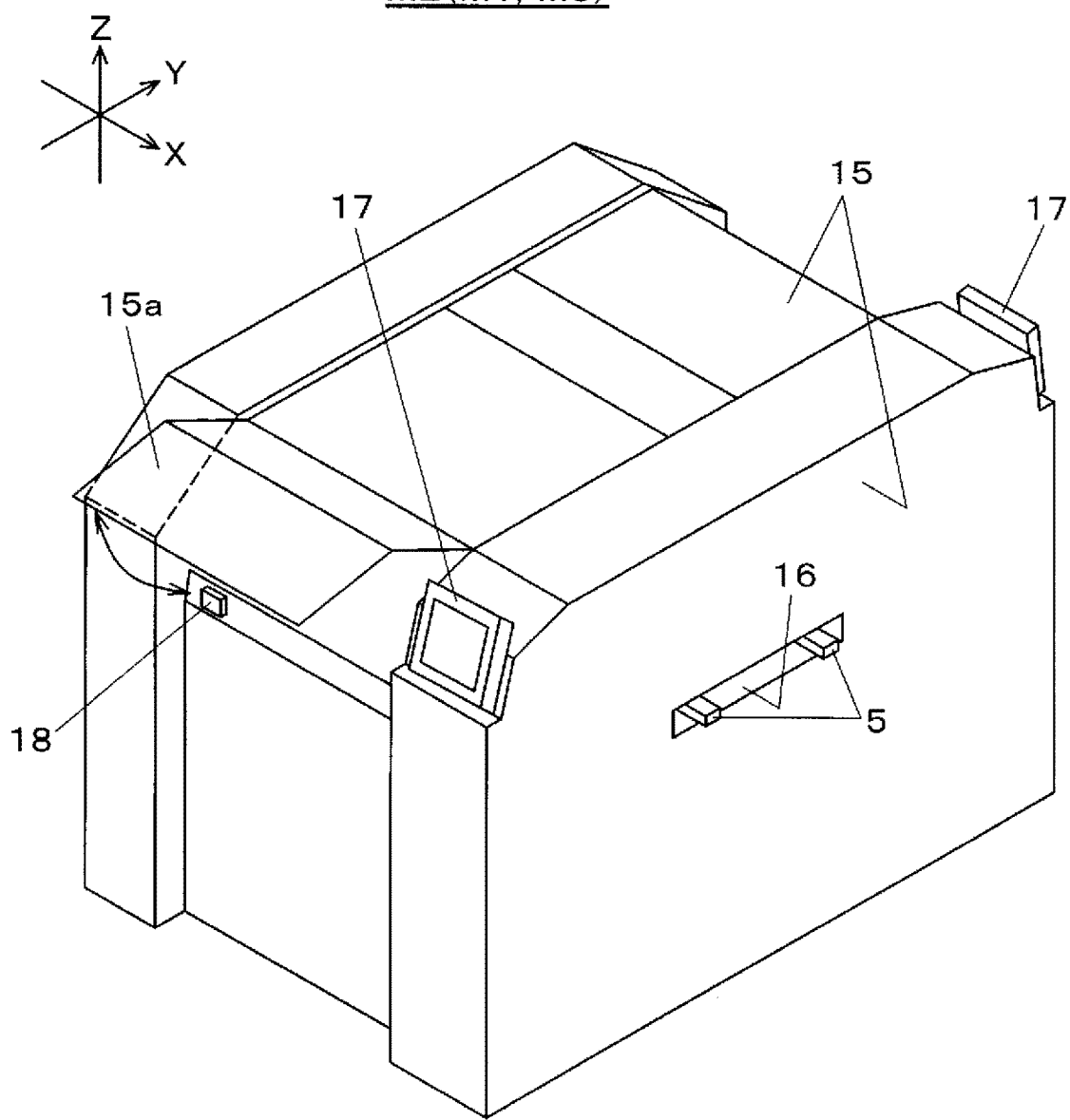
FIG. 4 is an explanatory diagram of a cover door sensor provided in the component mounting apparatus as an embodiment of the present disclosure.

Embodiments of the present disclosure will be described in detail below using the diagrams. The configurations, forms, and the like described below are exemplifications for description and are able to be appropriately modified in accordance with the specifications of the component mounting system. Below, the same reference numerals are given to the corresponding elements in all of the diagrams, and there are cases where overlapping description is omitted. In FIG. 2 and some description thereafter, the X direction (the left and right direction in FIG. 2) which is the substrate transport direction and the Y direction (the up and down direction in FIG. 2) orthogonal to the substrate transport direction are shown as directions across two axes perpendicular to each other within the horizontal plane. In FIG. 4, the Z direction is indicted as the height direction orthogonal to the horizontal plane. The Z direction is the up and down direction or the orthogonal direction in a case where the component mounting apparatus is installed on the horizontal plane.

Figure 1:
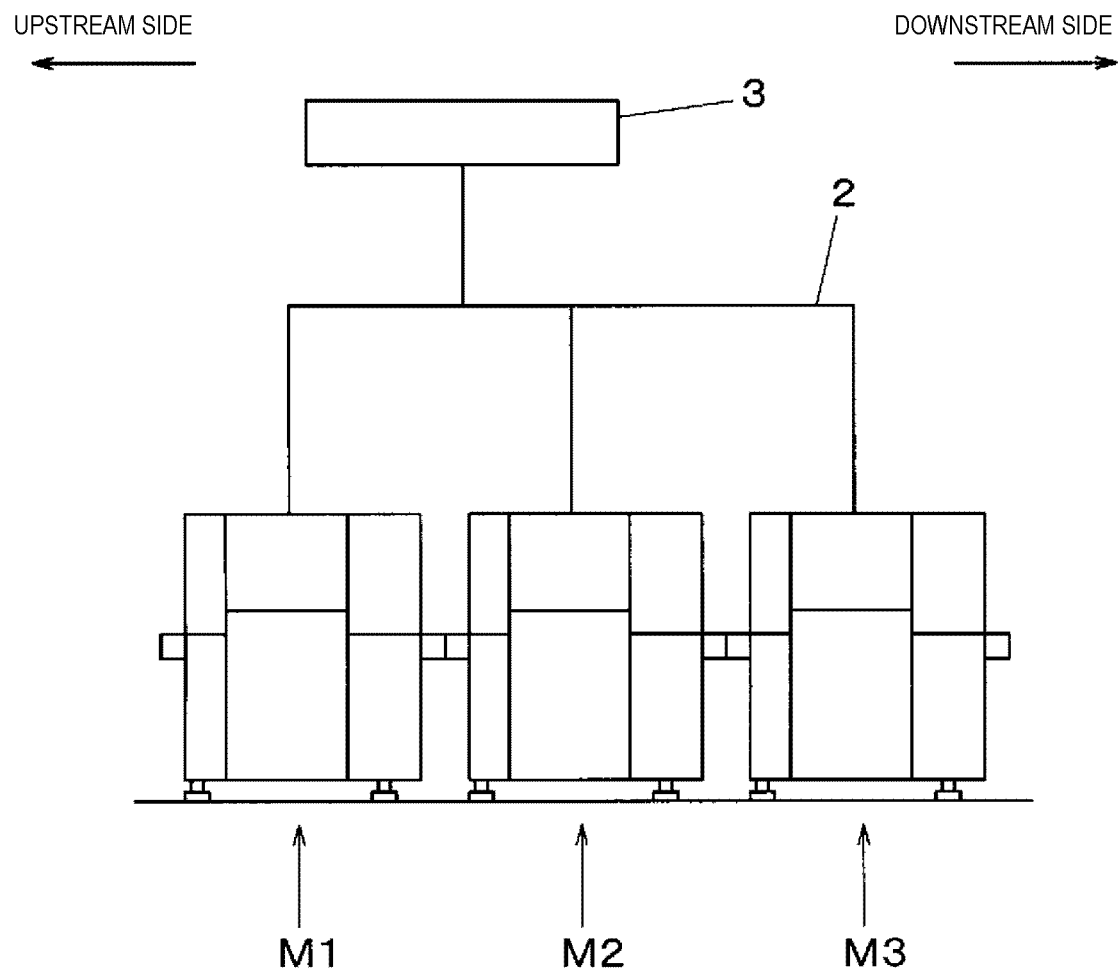
FIG. 1 is a diagram for explaining the configuration of a component mounting system as an embodiment of the present disclosure.

Firstly, component mounting system 1 will be described with reference to FIG. 1. Component mounting system 1 in FIG. 1 has a configuration such that component mounting apparatus M1, component mounting apparatus M2, and component mounting apparatus M3 are linked from the upstream side to the downstream side in the substrate transport direction and are connected using communication network 2, and all of the component mounting apparatuses are controlled using management computer 3. Component mounting system 1 has a function of producing a mounting substrate by mounting components on a substrate. Note that, the configuration of component mounting system 1 is not limited to the example in FIG. 1, and component mounting system 1 may be configured by linking four or more of the component mounting apparatuses or by one component mounting apparatus.

Next, the configuration of component mounting apparatuses M1 to M3 will be described with reference to FIG. 2. Component mounting apparatuses M1 to M3 have a common configuration and component mounting apparatus M2 will be described here. Component mounting apparatus M2 has a function of executing a component mounting operation for mounting components supplied from a component supply portion on a substrate using a mounting head. Substrate transport mechanism 5 is provided at the center of base platform 4 in the X direction. Substrate transport mechanism 5 introduces substrate 6 transported from the upstream side to the mounting operation position and positions and holds substrate 6. Substrate transport mechanism 5 delivers substrate 6 where the component mounting operation is complete from the mounting operation position to the downstream side.

Component supply portions 7 are disposed on both sides of substrate transport mechanism 5. Plurality of tape feeders 8 are attached in parallel to each of component supply portions 7. Tape feeders 8 supply the components to the component suction position using the mounting head which will be described below by pitch feeding carrier tape, formed with pockets for accommodating the components, in a direction (tape feeding direction) from the outer side of component supply portion 7 toward substrate transport mechanism 5.

Y-axis beam 9 provided with a linear drive mechanism is provided on the upper surface of base platform 4 at an end portion on one side in the X direction. Two groups of X-axis beams 10 provided with a linear drive mechanism in the same manner are joined with Y-axis beam 9 so as to be able to freely move in the Y direction. Mounting heads 11 are attached to two groups of X-axis beams 10 so as to be able to freely move in the X direction. Mounting heads 11 are provided with a plurality of holding heads. Suction nozzles which suction and hold the components are attached at the lower end portions of each of the holding heads.

Mounting heads 11 move in the X direction and in the Y direction by Y-axis beam 9 and X-axis beams 10 being driven. That is, Y-axis beam 9 and X-axis beams 10 configure mounting head movement mechanism 12 for moving mounting heads 11 within the horizontal plane. Using mounting head movement mechanism 12, two of mounting heads 11 take out the component from the component suction position of tape feeder 8 of corresponding component supply portion 7 using the suction nozzle and load the component once having moved to the mounting point for substrate 6 positioned by substrate transport mechanism 5.

In FIG. 2, component recognition camera 13 is provided between component supply portion 7 and substrate transport mechanism 5. Component recognition camera 13 takes images of the components in a state of being held by mounting head 11 when mounting head 11 which takes out the components from component supply portion 7 moves above component recognition camera 13. Due to this, recognition of the component held by mounting head 11 and recognition of the position are performed.

Substrate recognition cameras 14 are attached to mounting heads 11 so as to be positioned on the lower surface side of X-axis beams 10 to move integrally with respective mounting heads 11. Due to mounting heads 11 moving, substrate recognition cameras 14 move above substrate 6 positioned by substrate transport mechanism 5 and recognize position of substrate 6 by taking images of a substrate mark (not shown in the diagrams) provided on substrate 6. In the action of mounting the component on substrate 6 using mounting head 11, correction of the mounting position is performed by factoring in the results of the component recognition using component recognition camera 13 and the results of the substrate position recognition using substrate recognition camera 14.

In FIG. 2, substrate code C is added to the surface of substrate 6. Substrate code C is a bar code, a two-dimensional code, or the like for linking unique substrate IDs with each of substrates 6. Substrate recognition camera 14 recognizes the substrate ID by taking images of substrate code C. That is, substrate recognition camera 14 is one example of the recognition means for reading out substrate ID by taking images of substrate code C of substrate 6.

Next, the configuration of substrate transport mechanism 5 will be described with reference to FIG. 3. Substrate transport mechanism 5 is provided with introduction conveyor 5a, mounting conveyor 5b, delivery conveyor 5c, and substrate holding portion 21. Introduction conveyor 5a, mounting conveyor 5b, and delivery conveyor 5c are disposed above base platform 4 in order from the upstream side to the downstream side in the X direction. Introduction conveyor 5a, mounting conveyor 5b, and delivery conveyor 5c are each provided with a pair of transport belts 24a, 24b, and 24c, which are driven by transport motors 23a, 23b, and 23c, on the inner side of a pair of plate members 22 extending in the X direction. Due to this, introduction conveyor 5a, mounting conveyor 5b, and delivery conveyor 5c have a function of transporting substrate 6 in the X direction.

In detail, introduction conveyor 5a transports substrate 6, which is introduced from the upstream side of the apparatus prior to mounting of the components, to mounting conveyor 5b. Mounting conveyor 5b introduces substrate 6 prior to mounting of the components to mounting operation position WP and transports substrate 6 where mounting of the components is complete to delivery conveyor 5c. Delivery conveyor 5c transports substrate 6 where mounting of the components is complete to the downstream side of the apparatus.

Figure 3:
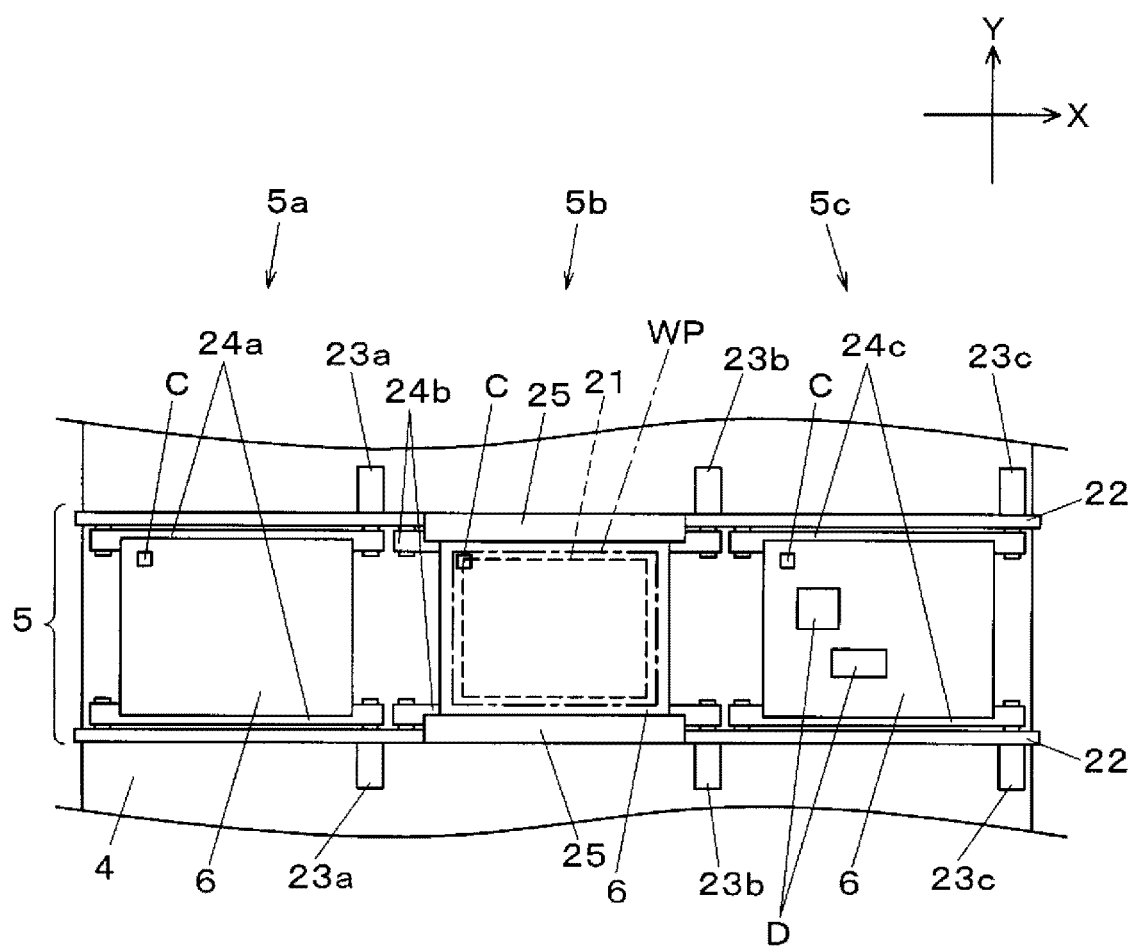
FIG. 3 is a planar view of a substrate transport mechanism provided in the component mounting apparatus as an embodiment of the present disclosure.

In FIG. 3, substrate holding portion 21 is provided on mounting conveyor 5b below mounting operation position WP. Pressing plate 25 overhanging above mounting conveyor 5b is installed at an upper end of plate members 22 positioned at mounting conveyor 5b. Substrate holding portion 21 has a function of supporting and lifting substrate 6 raised and introduced to mounting operation position WP from below and pressing and holding both end parts of lifted substrate 6 to the lower surface of pressing plate 25. Substrate holding portion 21 lowers and places substrate 6 on transport belt 24b of mounting conveyor 5b when substrate 6 is being introduced and delivered.

In component mounting apparatus M2, taking images of substrate code C using substrate recognition camera 14 and mounting of component D using mounting head 11 are executed with regard to substrate 6 held using substrate holding portion 21 and pressing plate 25 at mounting operation position WP. That is, component mounting apparatus M2 has mounting head 11 for mounting component D on substrate 6 and mounting head movement mechanism 12 (the movement means) for moving mounting head 11 within the horizontal plane. Substrate recognition camera 14 (the recognition means) moves integrally with mounting head 11 and reads out the substrate ID by taking images of substrate code C of substrate 6 held at the position (mounting operation position WP) where component D is mounted using mounting head 11.

Next, the outer appearance of component mounting apparatus M2 will be described with reference to FIG. 4. The upper surface and the four side surfaces of component mounting apparatus M2 are closed off using cover member 15. Openings 16 for substrates 6 to pass through are provided in cover member 15 for covering each of the side surfaces on the upstream side and the downstream side of component mounting apparatus M2 in the substrate transport direction (the X direction) so that openings 16 are positioned at ends on the upstream side and the downstream side of substrate transport mechanism 5. The apparatus side surface of component mounting apparatus M2 in the Y direction is a manipulation surface for an operator to perform manipulation of the apparatus and is provided with touch panel 17 provided with the dual functions of displaying and inputting.

In order for an operator to access each portion of component mounting apparatus M2 with the objective of dealing with maintenance and inspection, switching between device types, apparatus errors during a component mounting operation, and the like, cover door 15a is provided in the manipulation surface side so that a part of cover member 15 is able to be freely opened and closed. Cover door sensor 18 such as a micro-switch for detecting the opening and closing state of cover door 15a is provided in cover member 15. The results of the detection by cover door sensor 18 are transmitted to mounting control portion 31 (refer to FIG. 5). When cover door sensor 18 detects that cover door 15a is in an open state, mounting control portion 31 stops the component mounting operation such as transporting of substrate 6 using substrate transport mechanism 5.

In a state where cover door 15a is open, the operator is able to access substrate 6 in introduction conveyor 5a, mounting conveyor 5b, and delivery conveyor 5c of substrate transport mechanism 5 and execute removal of substrate 6 or insertion of substrate 6 into an empty conveyor (operation for inserting and removing substrate 6). That is, cover door sensor 18 is one example of the state detection means for detecting that substrate 6 is in a state of being able to be inserted or removed due to cover door 15a being open. When cover door sensor 18 detects that cover door 15a is closed, mounting control portion 31 restarts the component mounting operation. Note that, the state detection means is not limited to cover door sensor 18 and it is sufficient if the state detection means is able to detect that substrate 6 is in a state where insertion and removal are possible. For example, the state detection means may be a sensor or the like for detecting the hand or the like of the operator who is attempting to access substrate 6 in substrate transport mechanism 5.

Next, the control system of component mounting system 1 will be described with reference to FIG. 5. Component mounting apparatuses M1 to M3 have a common configuration and component mounting apparatus M2 will be described here. In this case, component mounting apparatus M1 is upstream component mounting apparatus M1 and component mounting apparatus M3 is downstream component mounting apparatus M3. Component mounting apparatus M2 is provided with mounting control portion 31, mounting storage portion 32, substrate transport mechanism 5, component supply portion 7, mounting head 11, mounting head movement mechanism 12, component recognition camera 13, substrate recognition camera 14, touch panel 17, cover door sensor 18, and communication portion 33.

Mounting storage portion 32 stores necessary parameters for the mounting operation so as to control each portion using mounting control portion 31 as well as various types of data such as substrate ID information 32a. The substrate ID, which is read out by images being taken of substrate code C of substrate 6 held at mounting operation position WP using substrate recognition camera 14, is included in substrate ID information 32a. Mounting control portion 31 is a computation processing apparatus provided with the functions of a CPU and is provided with information acquisition portion 31a, information transmission portion 31b, recognition request acquisition portion 31c, and recognition request transmission portion 31d as internal processing functions.

Mounting control portion 31 executes the component mounting operation by controlling substrate transport mechanism 5, component supply portion 7, mounting head 11, and mounting head movement mechanism 12. The component mounting operation is an operation where substrate 6 is introduced to and positioned and held at mounting operation position WP and component D supplied from component supply portion 7 is sent to and loaded at the mounting point for substrate 6 using mounting head 11. Mounting control portion 31 controls mounting head movement mechanism 12 and substrate recognition camera 14 and reads out the substrate ID by taking images of substrate code C of substrate 6 held at mounting operation position WP.

Mounting control portion 31 delivers substrate 6 at mounting operation position WP to the downstream apparatus by controlling substrate transport mechanism 5. Mounting control portion 31 controls stopping and restarting of the component mounting operation such as introduction and delivery of substrate 6, taking images of substrate code C, and movement and loading of component D by receiving the detection results of the opening and closing state of cover door 15a from cover door sensor 18. Mounting control portion 31 transmits the history of the component mounting operation (the mounting history) to management computer 3 so as to be linked with the substrate ID of substrate 6 which is the target for the operation.

Figure 5:
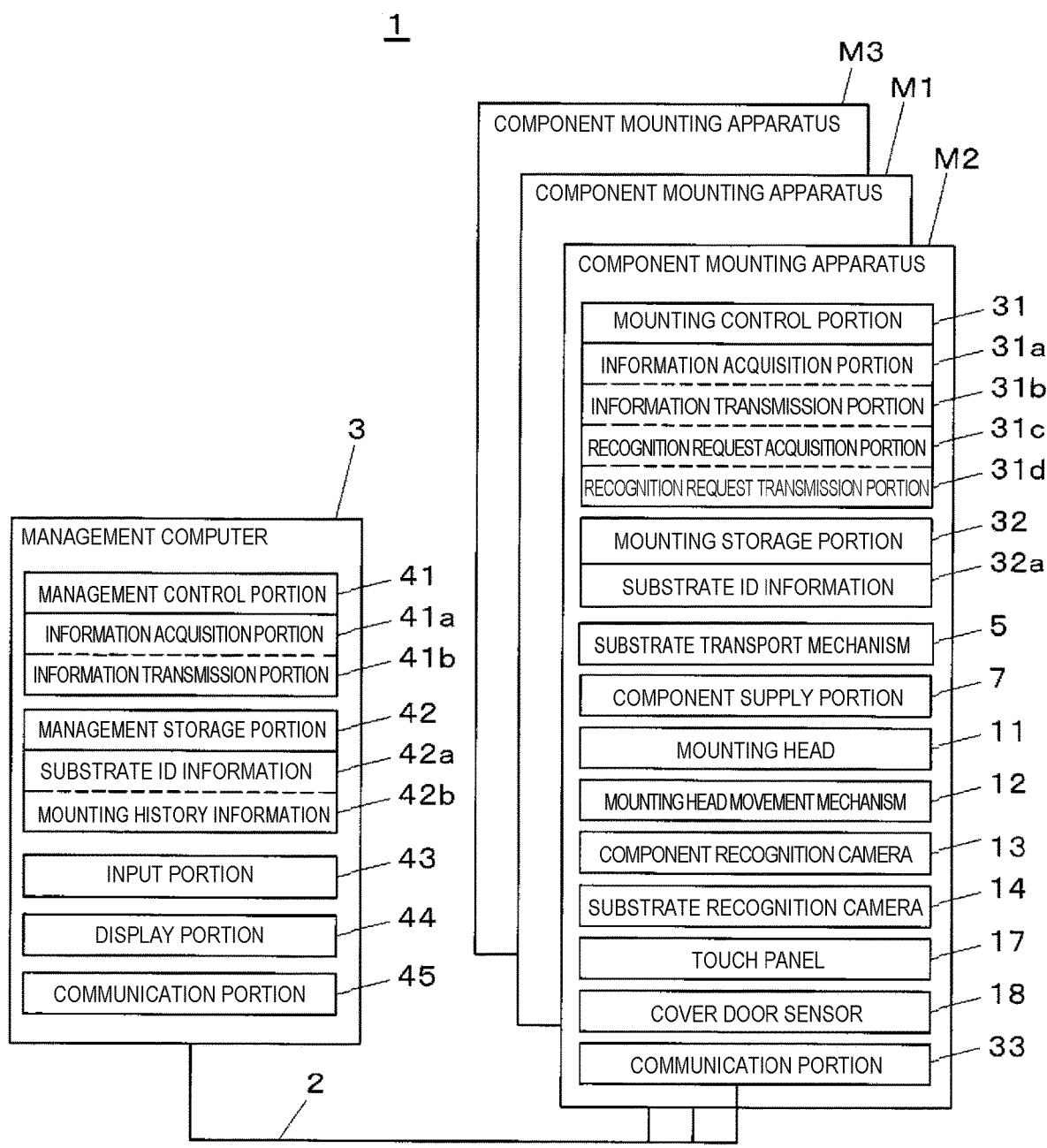
FIG. 5 is a block diagram illustrating a configuration of a control system for the component mounting system as an embodiment of the present disclosure.

In FIG. 5, information acquisition portion 31a acquires the substrate ID of substrate 6, which is delivered by component mounting apparatus M1 to component mounting apparatus M2 with the substrate ID being transmitted from upstream component mounting apparatus M1, via communication portion 33 and stores the substrate ID of substrate 6 in mounting storage portion 32 as substrate ID information 32a. Note that, information acquisition portion 31a acquires the substrate ID directly from upstream component mounting apparatus M1 or via management computer 3. Information transmission portion 31b transmits the substrate ID of substrate 6, which is delivered to downstream component mounting apparatus M3 with the substrate ID stored in mounting storage portion 32 as substrate ID information 32a, to downstream component mounting apparatus M3 via communication portion 33. Note that, information transmission portion 31b transmits the substrate ID directly to downstream component mounting apparatus M3 or via management computer 3.

Recognition request acquisition portion 31c acquires recognition request R (command) for requesting that the substrate ID of substrate 6, which is delivered by component mounting apparatus M1 with substrate ID being transmitted from upstream component mounting apparatus M1, is read out at component mounting apparatus M2 via communication portion 33. Note that, recognition request acquisition portion 31c acquires recognition request R directly from upstream component mounting apparatus M1 or via management computer 3. Recognition request transmission portion 31d transmits recognition request R for requesting that the substrate ID of substrate 6 delivered by component mounting apparatus M2 is read out to downstream component mounting apparatus M3 via communication portion 33. Note that, recognition request transmission portion 31d transmits recognition request R directly to downstream component mounting apparatus M3 or via management computer 3.

Recognition request R is transmitted and acquired in order to transfer commands to acquire the correct substrate ID by re-recognizing (reading out) the substrate ID at downstream component mounting apparatus M2 (downstream component mounting apparatus M3 in a case where component mounting apparatus M2 is upstream component mounting apparatus M2) in a case where there is a possibility that cover door 15a of upstream component mounting apparatus M1 (component mounting apparatus M2) has been opened and substrate 6 in substrate transport mechanism 5 has been swapped by the operator.

Recognition request R includes information on the number (prescribed number) of substrates 6 for which the substrate ID has been read out at downstream component mounting apparatus M2 (downstream component mounting apparatus M3 in a case where component mounting apparatus M2 is upstream component mounting apparatus M2). The number of substrates 6 able to be inserted into and removed from component mounting apparatus M1 (component mounting apparatus M2) where it is detected by cover door sensor 18 (the state detection means) that substrate 6 is in a state of being able to be inserted or removed is specified as the prescribed number. That is, after cover door 15a is closed and the component mounting operation is restarted, the number of substrates 6, which are delivered to downstream component mounting apparatus M2 (component mounting apparatus M3) without the substrate ID being re-recognized by substrate recognition camera 14 of component mounting apparatus M1 (component mounting apparatus M2), is specified. In a case where the correct number to be transported is unclear, the maximum number of substrates 6 able to be held inside component mounting apparatus M1 (component mounting apparatus M2) is specified.

Touch panel 17 is provided with functions as a display portion and an input portion, displays various types of data, information, and the like, and is input with various types of manipulation commands, data, and the like. Communication portion 33 is a communication interface and performs sending and receiving of signals and data between management computer 3 and the other component mounting apparatus M1 and component mounting apparatus M3 via communication network 2.

In FIG. 5, management computer 3 is provided with management control portion 41, management storage portion 42, input portion 43, display portion 44, and communication portion 45. Management control portion 41 is a computation apparatus such as a CPU and manages component mounting system 1 on the basis of the information stored in management storage portion 42. In addition, management control portion 41 is provided with information acquisition portion 41a and information transmission portion 41b as internal processing functions. Management storage portion 42 is a storage apparatus and stores substrate ID information 42a, mounting history information 42b, and the like as well as the component mounting data.

Information acquisition portion 41a acquires information on the substrate ID of substrate 6, which is delivered to downstream component mounting apparatus M2 or M3 with the substrate ID being transmitted by component mounting apparatus M1 or M2, via communication portion 45 and stores the information on the substrate ID as substrate ID information 42a in management storage portion 42. Information transmission portion 41b transmits the substrate ID of substrate 6, which is delivered by upstream component mounting apparatus M1 or M2 to component mounting apparatus M2 or M3 from which the request is transmitted with the information on the substrate ID being stored as substrate ID information 42a in management storage portion 42, to component mounting apparatus M2 or M3 from which the request is transmitted via communication portion 45 in accordance with the request from component mounting apparatuses M1 to M3. Management control portion 41 stores the history of the component mounting operation (mounting history) transmitted from each of component mounting apparatuses M1 to M3 as mounting history information 42b linked to the substrate ID of substrate 6.

Next, a component mounting method for mounting component D on substrate 6 in component mounting system 1 provided with the plurality of component mounting apparatuses M1 to M3 for mounting component D on substrate 6 introduced from upstream and having the substrate ID and delivering substrate 6 downstream, will be described with reference to FIGS. 7A to 7C according to the flow in FIG. 6. The same processes are executed by component mounting apparatuses M1 to M3, and the example of component D being mounted on substrate 6 in component mounting apparatus M2 will be described below. In this case, component mounting apparatus M1 is the upstream component mounting apparatus and component mounting apparatus M3 is the downstream component mounting apparatus relative to component mounting apparatus M2. In FIGS. 7A to 7C, three of substrates 6 are represented as substrate 6a, substrate 6b, and substrate 6c.

Figure 6:
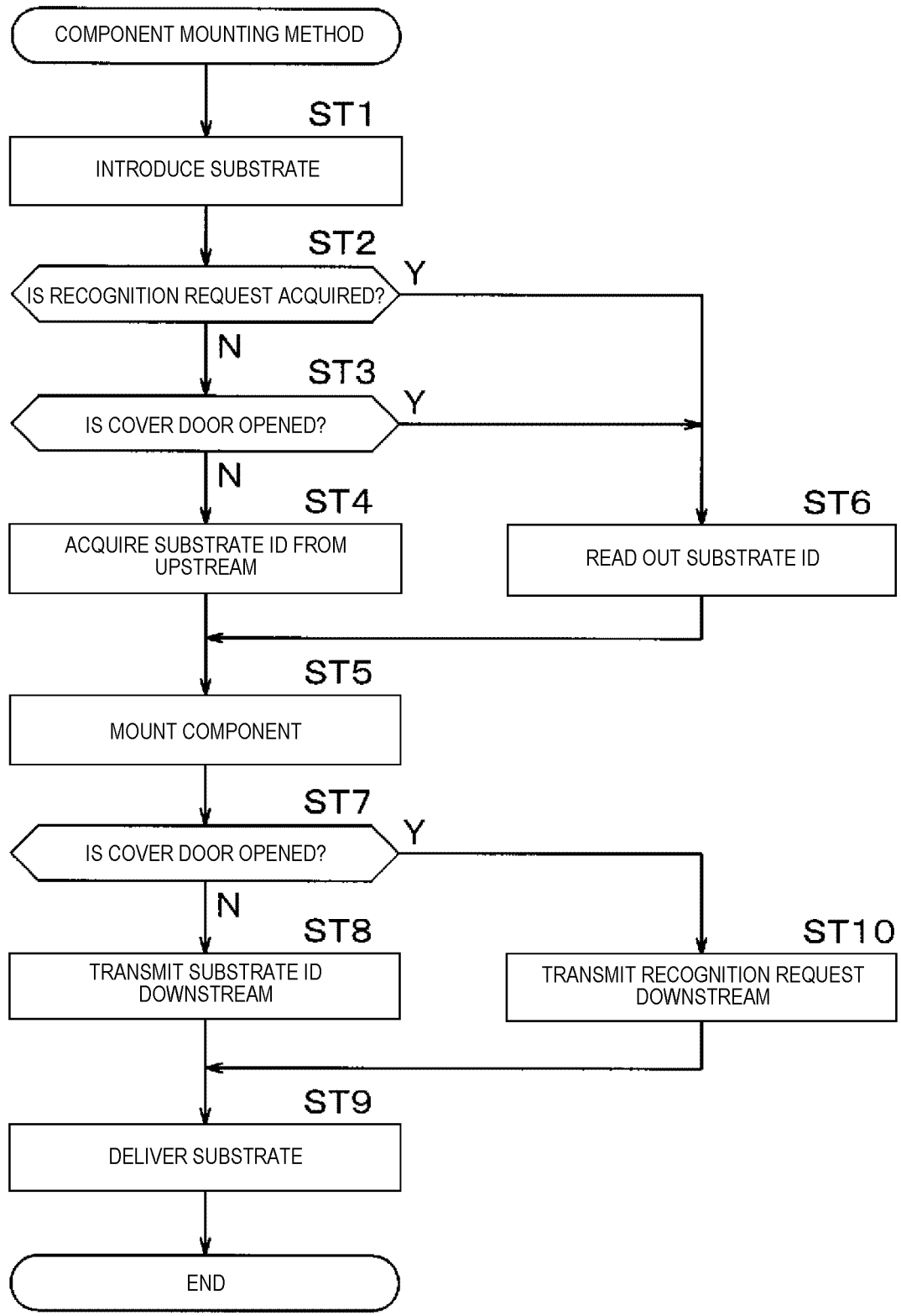
FIG. 6 is a flow diagram of a component mounting method for the component mounting apparatuses as an embodiment of the present disclosure.
Figure 7A:
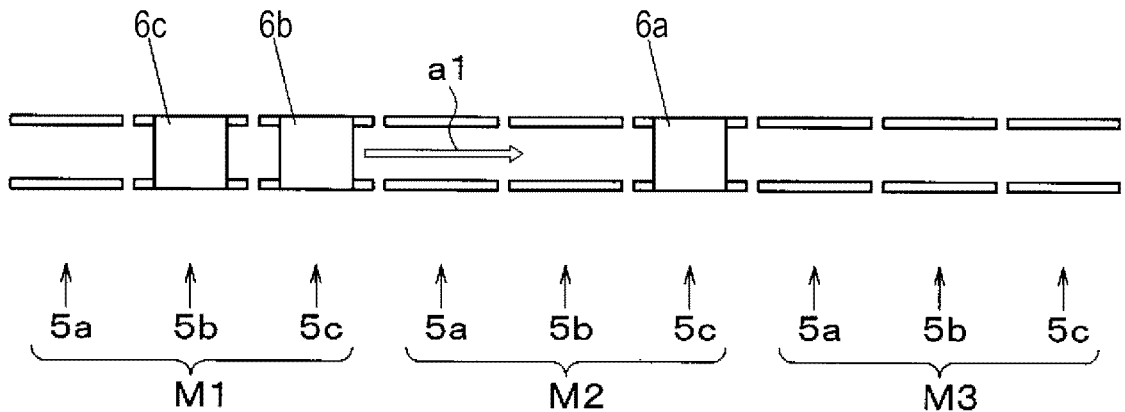
FIG. 7A is an explanatory diagram of the steps in the component mounting method for the component mounting apparatuses as an embodiment of the present disclosure.
Figure 7B:
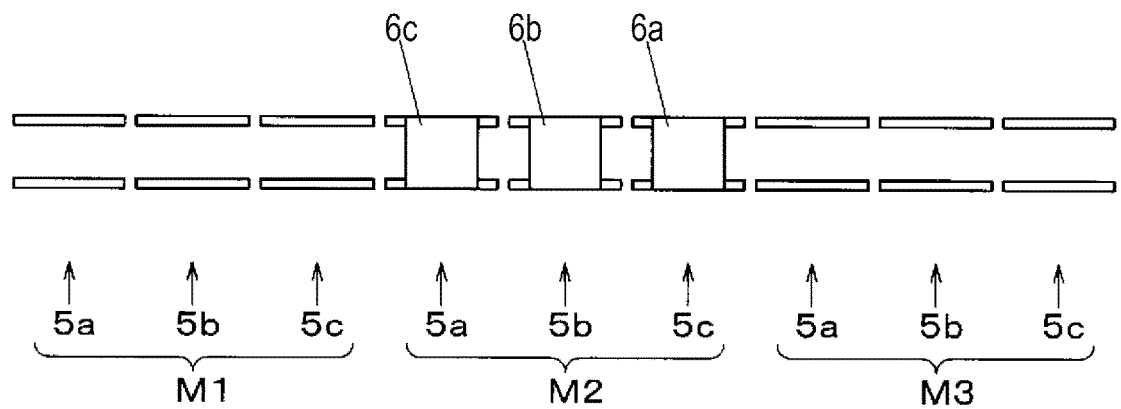
FIG. 7B is an explanatory diagram of the steps in the component mounting method for the component mounting apparatuses as an embodiment of the present disclosure.
Figure 7C:
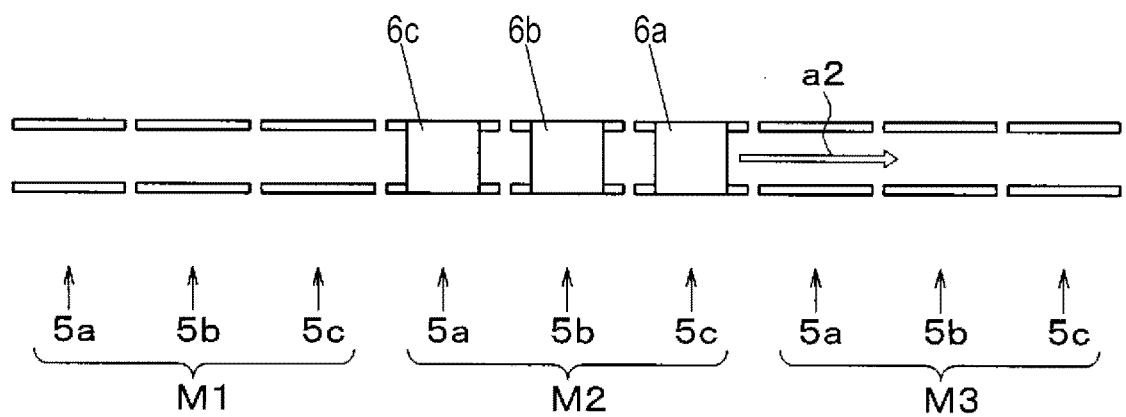
FIG. 7C is an explanatory diagram of the steps in the component mounting method for the component mounting apparatuses as an embodiment of the present disclosure.

In FIG. 6, first, mounting control portion 31 of component mounting apparatus M2 introduces, positions, and holds substrate 6 delivered from upstream component mounting apparatus M1 at mounting operation position WP of mounting conveyor 5b by controlling substrate transport mechanism 5 (ST1).

In FIG. 7A, substrate 6b, on which component D is mounted at component mounting apparatus M1 and which is transported on delivery conveyor 5c, is delivered from component mounting apparatus M1 and is transported to mounting conveyor 5b of component mounting apparatus M2 (arrow a1). At this time, substrate 6a on which component D is mounted at component mounting apparatus M2 is placed on delivery conveyor 5c of component mounting apparatus M2. In addition, substrate 6c on which component D is mounted is placed on mounting conveyor 5b of component mounting apparatus M1.

In a case where recognition request acquisition portion 31c does not acquire recognition request R from upstream component mounting apparatus M1 in FIG. 6 (No in ST2), mounting control portion 31 determines whether or not cover door 15a of component mounting apparatus M2 is open (ST3: first opening determination step) using the detection results on the opening and closing state of cover door 15a transmitted from cover door sensor 18. That is, using mounting control portion 31, it is determined whether or not it is detected by cover door sensor 18 (the state detection means) that substrate 6 is in a state of being able to be inserted or removed due to cover door 15a being open.

In a case where it is determined in the first opening determination step (ST3) that cover door 15a is not open (No), information acquisition portion 31a acquires the substrate ID of substrate 6b from upstream component mounting apparatus M1 (ST4: information acquisition step). That is, in a case where it is not detected that substrate 6 is in a state of being able to be inserted or removed at upstream component mounting apparatus M1 (No in ST2) and it is not detected by cover door sensor 18 (the state detection means) that substrate 6 is in a state of being able to be inserted or removed (No in ST3), information acquisition portion 31a executes an information acquisition step (ST4) for acquiring the substrate ID of substrate 6 delivered by upstream component mounting apparatus M1. Next, mounting control portion 31 mounts the component D on substrate 6b positioned and held at mounting operation position WP (ST5) and transmits the history of the component mounting operation (the mounting history) to management computer 3.

In a case where recognition request acquisition portion 31c acquires recognition request R from upstream component mounting apparatus M1 in FIG. 6 (Yes in ST2), mounting control portion 31 reads out the substrate ID by taking images of substrate code C of substrate 6b positioned and held at mounting operation position WP using substrate recognition camera 14 (ST6: read-out step). The reading out of the substrate ID is executed for the prescribed number of substrates 6 included in recognition request R. Due to this, even when cover door 15a is opened at upstream component mounting apparatus M1 and substrate 6 is swapped, inconsistencies in mounting history information 42b (tracing) do not occur due to the substrate IDs of substrates 6 for which there is a possibility of swapping being read out.

In FIG. 7A, substrate 6b is on delivery conveyor 5c and substrate 6c is on mounting conveyor 5b in component mounting apparatus M1. When cover door 15a of component mounting apparatus M1 is released in this state, the operator is able to insert or remove substrate 6b or substrate 6c. When the operator takes out and swaps substrate 6b or substrate 6c and places substrate 6b or substrate 6c on a different conveyor in this state, the substrate ID of substrate 6 placed on the conveyor and the stored substrate ID in substrate ID information 32a no longer match.

When the component mounting operation is restarted in this state, erroneous history for the component mounting operation (the mounting history) is stored. Therefore, substrate ID information 32a in mounting storage portion 32 is updated by reading out the substrate IDs of substrate 6b and substrate 6c for which there is a possibility of swapping in component mounting apparatus M1 before the component mounting operation is restarted in component mounting apparatus M2 and component D is mounted on substrate 6 delivered from component mounting apparatus M1 at mounting operation position WP.

In a case where it is determined in the first opening determination step (ST3) that cover door 15a is open in FIG. 6 (Yes), mounting control portion 31 stops the component mounting operation. After this, when it is confirmed that cover door 15a is closed from the detection results from cover door sensor 18, mounting control portion 31 executes a read-out step (ST6) for reading out the substrate ID by taking images of substrate code C of substrate 6b positioned and held at mounting operation position WP using substrate recognition camera 14. The reading out of the substrate ID is executed for component mounting apparatus M2 when cover door 15a is closed with regard to all of substrates 6, for which the substrate ID is able to be re-recognized using substrate recognition camera 14, in component mounting apparatus M2 after restarting of the component mounting operation.

In FIG. 7B, substrate 6a is on delivery conveyor 5c, substrate 6b is on mounting conveyor 5b, and substrate 6c is on introduction conveyor 5a in component mounting apparatus M2. When cover door 15a of component mounting apparatus M2 is released in this state, the operator is able to insert or remove substrates 6a to 6c. When the operator takes out and swaps substrates 6a to 6c and places substrates 6a to 6c on a different conveyor in this state, the substrate ID of substrate 6 placed on the conveyor and the stored substrate ID in substrate ID information 32a no longer match. When the component mounting operation is restarted in this state, erroneous history for the component mounting operation (the mounting history) is stored.

Therefore, substrate ID information 32a in mounting storage portion 32 is updated by reading out the substrate IDs of substrate 6b on mounting conveyor 5b and substrate 6c on introduction conveyor 5a for which there is a possibility of swapping before the component mounting operation is restarted in component mounting apparatus M2 and component D is mounted at mounting operation position WP. That is, in a case where it is detected by cover door sensor 18 (the state detection means) that substrate 6 is in a state of being able to be inserted or removed (Yes in ST3), substrate recognition camera 14 (the recognition means) reads out the prescribed number of the substrate IDs of substrates 6 on which components D are mounted. Note that, the prescribed number is the number of substrates 6 able to be inserted into and removed from component mounting apparatus M2 where it is detected by cover door sensor 18 (the state detection means) that substrate 6 is in a state of being able to be inserted or removed.

In FIG. 6, next, mounting control portion 31 mounts component D on substrate 6b positioned and held at mounting operation position WP (ST5) and the history of the component mounting operation (the mounting history) is transmitted to management computer 3. In this manner, even in a case where the substrate 6 is inserted into or removed from component mounting apparatuses M1 to M3, it is possible to suppress reductions in production efficiency of the mounting substrate without inconsistencies in mounting history information 42*b* (tracing) occurring due to the substrate IDs of only substrates 6 for which there is a possibility of swapping being read out. Note that, in this example, the "prescribed number" of substrates 6 for which the substrate ID is read out in component mounting apparatus M2 is the two substrates of substrates 6 on introduction conveyor 5*a* and mounting conveyor 5*b* of component mounting apparatus M2. The "prescribed number" is modified in accordance with the configuration and the state of component mounting apparatus M2.

In FIG. 6, with the transporting of substrate 6*a* on which component D is mounted from component mounting apparatus M2 (arrow a2 in FIG. 7C), mounting control portion 31 determines whether or not cover door 15*a* of component mounting apparatus M2 is open from the detection results of the opening and closing state of cover door 15*a* transmitted from cover door sensor 18 (ST7: second opening determination step). To describe in more detail, it is determined whether or not cover door 15*a* is open from the mounting of component D at mounting operation position WP in component mounting apparatus M2 to the delivery from component mounting apparatus M2.

In a case where it is determined that cover door 15*a* is not open in the second opening determination step (ST7) (No), information transmission portion 31*b* transmits the substrate ID of substrate 6*a* delivered to downstream component mounting apparatus M3 with the substrate ID stored as substrate ID information 32*a* (ST8: information transmission step). Next, mounting control portion 31 delivers substrate 6*a* using delivery conveyor 5*c* (ST9).

That is, in a case where it is not detected by cover door sensor 18 (the state detection means) that substrate 6*a* is in a state of being able to be inserted or removed in the first opening determination step (ST3) (No in ST3), the substrate ID stored by being acquired from upstream component mounting apparatus M1 is transmitted to downstream component mounting apparatus M3 as the substrate ID of delivered substrate 6*a* in the information transmission step (ST8). In addition, in a case where it is detected by cover door sensor 18 (the state detection means) that substrate 6*a* is in a state of being able to be inserted or removed in the first opening determination step (ST3) (Yes in ST3), the substrate ID read out using substrate recognition camera 14 is transmitted to downstream component mounting apparatus M3 as the substrate ID of delivered substrate 6*a* in the information transmission step (ST8). In this manner, the substrate ID transmitted to component mounting apparatus M3 is acquired using information acquisition portion 31*a* of component mounting apparatus M3 and is stored as substrate ID information 32*a* in mounting storage portion 32 of component mounting apparatus M3.

In FIG. 6, in a case where it is determined in the second opening determination step (ST7) that cover door 15*a* is open (Yes), mounting control portion 31 stops the component mounting operation. After this, when it is confirmed that cover door 15*a* is closed from the detection results from cover door sensor 18, recognition request transmission portion 31*d* transmits recognition request R to downstream component mounting apparatus M3 (ST10: recognition request transmission step), and mounting control portion 31 delivers substrate 6*a* using delivery conveyor 5*c* (ST9).

The component mounting operation is executed in component mounting apparatus M3 described below using the component mounting method where upstream component mounting apparatus M1 is replaced with component mounting apparatus M2 in ST1 to ST10 described above with regard to substrate 6*a* delivered from component mounting apparatus M2 and introduced to component mounting apparatus M3. In this case, component mounting apparatus M2 is the upstream component mounting apparatus relative to component mounting apparatus M3.

That is, when recognition request acquisition portion 31*c* of component mounting apparatus M3 acquires recognition request R transmitted from upstream component mounting apparatus M2 (Yes in ST2 at component mounting apparatus M3), mounting control portion 31 of component mounting apparatus M3 executes the read-out step (ST6 at component mounting apparatus M3) for reading out the substrate ID by taking images of substrate code C of substrate 6*a* positioned and held at mounting conveyor 5*b* at mounting operation position WP before component D is mounted on substrate 6*a* introduced to component mounting apparatus M3. The read-out substrate ID is stored as substrate ID information 32*a* in mounting storage portion 32 of component mounting apparatus M3.

In FIG. 7C, substrate 6*a* is on delivery conveyor 5*c*, substrate 6*b* is on mounting conveyor 5*b*, and substrate 6*c* is on introduction conveyor 5*a* in component mounting apparatus M2. When cover door 15*a* of component mounting apparatus M2 is released in this state, the operator is able to insert or remove substrates 6*a* to 6*c*. When the operator takes out and swaps substrates 6*a* to 6*c* and places substrates 6*a* to 6*c* on a different conveyor in this state, the substrate ID of substrate 6 placed on the conveyor and the stored substrate ID in substrate ID information 32*a* no longer match. When the component mounting operation is restarted in this state, erroneous history for the component mounting operation (the mounting history) is stored.

Therefore, the substrate ID of substrate 6 for which there is a possibility of swapping in component mounting apparatus M2 is read out and stored as substrate ID information 32*a* in mounting storage portion 32 in downstream component mounting apparatus M3 before the component mounting operation is restarted in upstream component mounting apparatus M2 and component D is mounted at mounting operation position WP on substrate 6 delivered and introduced to component mounting apparatus M3. In this example, when cover door 15*a* is opened, substrate 6*a* on delivery conveyor 5*c* and substrate 6*b* on mounting conveyor 5*b* in component mounting apparatus M2 are the targets for which the substrate ID is to be read out at component mounting apparatus M3.

That is, in a case where it is detected that substrate 6 is in a state of being able to be inserted or removed in upstream component mounting apparatus M2 (Yes in ST7 at component mounting apparatus M2), upstream component mounting apparatus M2 transmits recognition request R for requesting that the substrate ID of delivered substrate 6 is read out to downstream component mounting apparatus M3 (ST10 at component mounting apparatus M2), and substrate recognition camera 14 (the recognition means) of downstream component mounting apparatus M3 that acquires transmitted recognition request R (Yes in ST2 at component mounting apparatus M3) reads out the prescribed number of the substrate IDs of substrates 6 on which components D are mounted (ST6 at component mounting apparatus M3). Note that, the prescribed number is the number of substrates 6 able to be inserted into and removed from component mounting apparatus M2 where it is detected by cover door sensor 18 (the state detection means) that substrate 6 is in a state of being able to be inserted or removed.

In this manner, even in a case where substrate 6 is inserted into or removed from component mounting apparatuses M1 to M3, it is possible to suppress reductions in production efficiency of the mounting substrate without inconsistencies in mounting history information 42b (tracing) occurring due to the substrate IDs of only substrates 6 for which there is a possibility of swapping being read out. Note that, in this example, the "prescribed number" of substrates 6 for which the substrate ID is read out in downstream component mounting apparatus M3 is the two substrates of substrates 6 on mounting conveyor 5b and delivery conveyor 5c of upstream component mounting apparatus M2. The "prescribed number" is modified in accordance with the configuration and the state of component mounting apparatus M2. For example, in a case where components are not mounted (the substrate ID is not read out) at component mounting apparatus M2, the "prescribed number" is three with the addition of substrate 6c on introduction conveyor 5a.

In addition, processing is described for component mounting apparatus M2 in the description above with component mounting apparatus M1 upstream and component mounting apparatus M3 downstream, but the component mounting method of the present exemplary embodiment is not limited to this combination. For example, it is possible to suppress reductions in production efficiency of the mounting substrate without inconsistencies in mounting history information 42b (tracing) occurring by executing the same processes even in component mounting apparatus M1 with component mounting apparatus M2 downstream or in component mounting apparatus M3 with component mounting apparatus M2 upstream.

As described above, component mounting system 1 of the present exemplary embodiment is provided with the plurality of component mounting apparatuses M1 to M3 for mounting component D on substrate 6 introduced from upstream and delivering substrate 6 downstream. Each of component mounting apparatuses M1 to M3 has the recognition means (substrate recognition camera 14) for reading out the substrate ID by taking images of substrate code C of substrate 6, the state detection means (cover door sensor 18) for detecting whether substrate 6 is in a state of being able to be inserted or removed, and information acquisition portion 31a for acquiring the substrate ID of substrate 6 delivered by the upstream component mounting apparatus with the substrate ID being transmitted from the upstream component mounting apparatus.

Then, in component mounting system 1, for example, in a case where it is not detected by the state detection means (cover door sensor 18) of component mounting apparatus M2 that substrate 6 is in a state of being able to be inserted or removed, the substrate ID of substrate 6 delivered by upstream component mounting apparatus M1 is acquired. In a case where it is detected by the state detection means that substrate 6 is in a state of being able to be inserted or removed, the recognition means (substrate recognition camera 14) reads out the prescribed number of the substrate IDs of substrates 6 on which components D are mounted. Due to this, it is possible to suppress reductions in production efficiency of the mounting substrate without inconsistencies in tracing occurring even in a case where substrate 6 on which component D is mounted in component mounting apparatus M2 is inserted or removed.

Note that, component mounting system 1 may be provided with, for example, a substrate feeding apparatus further upstream of component mounting apparatus M1. In this case, component mounting apparatus M1 acts as the downstream component mounting apparatus relative to the substrate feeding apparatus. That is, component mounting apparatus M1 may acquire the substrate ID from the substrate feeding apparatus and transmit the substrate ID to downstream component mounting apparatus M2. In addition, component mounting system 1 may be provided with, for example, a reflow apparatus downstream of component mounting apparatus M3. In this case, component mounting apparatus M3 acts as the upstream component mounting apparatus relative to the reflow apparatus. That is, component mounting apparatus M3 transmits the recognition request to the reflow apparatus in a case where it is detected by the state detection means (cover door sensor 18) that substrate 6 is in a state of being able to be inserted or removed.

The component mounting system and the component mounting method of the present disclosure have an effect in that it is possible to suppress reductions in production efficiency of the mounting substrate in the component mounting apparatuses, and the component mounting system and the component mounting method are effective in the field for component mounting where components are mounted on a substrate.

What is claimed is:

1. A component mounting method for mounting components on a substrate, the method comprising: reading a substrate ID of a substrate by a first substrate recognition camera; transporting the substrate to a component mounting apparatus located at a position downstream from the first substrate recognition camera; detecting a state of the component mounting apparatus, wherein detecting the state of the component mounting apparatus detects whether a cover door of the component mounting apparatus is open and thus the substrate is capable of being inserted into or removed from the component mounting apparatus, if it is detected that the cover door is closed, then the substrate is not capable of being inserted into or removed from the component mounting apparatus, in this case acquiring the substrate ID read by the first substrate recognition camera; and if the substrate is capable of being inserted into or removed from the component mounting apparatus, reading the substrate ID of the substrate by a second substrate recognition camera, closing the component mounting apparatus cover door; and mounting at least one component on the substrate by the component mounting apparatus.

2. The component mounting method of claim 1,
wherein acquiring the substrate ID read by the first substrate recognition camera further comprises, transmitting the substrate ID to the component mounting apparatus from an apparatus located at a position upstream of the component mounting apparatus.

3. The component mounting method of claim 1, further comprising:
detecting whether the substrate is capable of being inserted or removed at an apparatus located at a position upstream of the component mounting apparatus,
if the substrate is detected as being capable of being inserted or removed at the upstream apparatus, the upstream apparatus transmitting a recognition request for requesting that the substrate ID of the substrate is read by the component mounting apparatus.

4. The component mounting method of claim 1, further comprising:

determining a number of substrates capable of being inserted into and removed from the component mounting apparatus; and acquiring or reading a number of substrate IDs equal to the determined number of substrates.

\* \* \* \* \*